US008148981B2

United States Patent
Yui

(10) Patent No.: US 8,148,981 B2
(45) Date of Patent: Apr. 3, 2012

(54) MRI APPARATUS AND MRI METHOD FOR SSFP WITH CENTER FREQUENCY AND 1ST ORDER GRADIENT MOMENTS ZEROED

(75) Inventor: Masao Yui, Otawara (JP)

(73) Assignees: Kabushiki Kaisha Toshiba, Minato-Ku, Tokyo (JP); Toshiba Medical Systems Corporation, Otawara-shi, Tochigi-Ken (JP)

( * ) Notice: Subject to any disclaimer, the term of this patent is extended or adjusted under 35 U.S.C. 154(b) by 498 days.

(21) Appl. No.: 12/336,708

(22) Filed: Dec. 17, 2008

(65) Prior Publication Data

US 2009/0160440 A1 Jun. 25, 2009

(30) Foreign Application Priority Data

Dec. 20, 2007 (JP) ................................ 2007-329006
Oct. 31, 2008 (JP) ................................ 2008-281995

(51) Int. Cl.
*G01V 3/00* (2006.01)

(52) U.S. Cl. .......................... 324/309; 324/307; 324/318
(58) Field of Classification Search .......... 324/300–322; 600/407–435; 383/128–131
See application file for complete search history.

(56) References Cited

U.S. PATENT DOCUMENTS

| 2,705,790 | A | * | 4/1955 | Hahn ............................. 365/152 |
| 3,075,156 | A | * | 1/1963 | Anderson et al. ............ 331/94.1 |
| 3,530,373 | A | * | 9/1970 | Waugh .......................... 324/311 |
| 3,530,374 | A | * | 9/1970 | Waugh et al. ................. 324/311 |
| 3,729,674 | A | * | 4/1973 | Lowdenslager .............. 324/307 |
| 4,412,179 | A | * | 10/1983 | Brown .......................... 324/303 |
| 4,551,679 | A | * | 11/1985 | Bossaert ........................ 324/309 |
| 4,769,603 | A |   | 9/1988 | Oppelt et al. ................. 324/309 |
| 4,973,906 | A | * | 11/1990 | Bernstein ....................... 324/309 |
| 5,148,109 | A | * | 9/1992 | Takane et al. ................. 324/309 |
| 5,455,512 | A | * | 10/1995 | Groen et al. .................. 324/309 |
| 5,926,022 | A | * | 7/1999 | Slavin et al. .................. 324/309 |
| 6,587,708 | B2 | * | 7/2003 | Venkatesan et al. .......... 600/419 |
| 6,856,132 | B2 | * | 2/2005 | Appel et al. .................. 324/303 |
| 6,922,054 | B2 | * | 7/2005 | Hargreaves et al. .......... 324/307 |
| 7,020,509 | B2 |   | 3/2006 | Heid .............................. 600/410 |
| 2003/0030435 | A1 | * | 2/2003 | Venkatesan et al. .......... 324/306 |
| 2004/0090230 | A1 | * | 5/2004 | Appel et al. .................. 324/307 |
| 2004/0113613 | A1 | * | 6/2004 | Markl et al. ................... 324/306 |
| 2005/0040821 | A1 | * | 2/2005 | Hargreaves et al. .......... 324/307 |
| 2009/0134871 | A1 | * | 5/2009 | Yui ................................ 324/309 |
| 2009/0160440 | A1 | * | 6/2009 | Yui ................................ 324/307 |
| 2009/0256563 | A1 | * | 10/2009 | Lee et al. ...................... 324/309 |

* cited by examiner

*Primary Examiner* — Melissa Koval
*Assistant Examiner* — Tiffany Fetzner
(74) *Attorney, Agent, or Firm* — Nixon & Vanderhye PC

(57) ABSTRACT

A magnetic resonance imaging apparatus includes an input unit, a data acquisition unit and an image generating unit. The input unit inputs information indicating a matter of which resonance frequency is a center frequency of an excitation pulse. The data acquisition unit acquires magnetic resonance data with obtaining a steady state free precession. Each of the plural excitation pulses has a transmission phase varying by a variation amount determined based on a difference between a resonance frequency and the center frequency. The image generating unit generates an image of the desired matter based on the magnetic resonance data.

16 Claims, 10 Drawing Sheets

| n | 1 | 2 | 3 | 4 | 5 | 6 | 7 | 8 | 9 | 10 |
|---|---|---|---|---|---|---|---|---|---|----|
| PE (n) | -5 | -4 | -3 | -2 | -1 | 0 | 1 | 2 | 3 | 4 |
| φ (n) | 0 | $\pi+\Delta\phi$ | $2\Delta\phi$ | $\pi+3\Delta\phi$ | $4\Delta\phi$ | $\pi+5\Delta\phi$ | $6\Delta\phi$ | $\pi+7\Delta\phi$ | $8\Delta\phi$ | $\pi+9\Delta\phi$ |
| Φ (n) | $\pi$ | $\pi+\Delta\phi$ | $\pi+2\Delta\phi$ | $\pi+3\Delta\phi$ | $\pi+4\Delta\phi$ | $\pi+5\Delta\phi$ | $\pi+6\Delta\phi$ | $\pi+7\Delta\phi$ | $\pi+8\Delta\phi$ | $\pi+9\Delta\phi$ |
| θ (n) | $\pi$ | 0 | $\pi$ | 0 | $\pi$ | 0 | $\pi$ | 0 | $\pi$ | 0 |

FIG. 14

| n | 1 | 2 | 3 | 4 | 5 | 6 | 7 | 8 | 9 | 10 |
|---|---|---|---|---|---|---|---|---|---|----|
| PE (n) | 0 | -1 | 1 | -2 | 2 | -3 | 3 | -4 | 4 | -5 |
| φ (n) | 0 | $\pi+\Delta\phi$ | $2\Delta\phi$ | $\pi+3\Delta\phi$ | $4\Delta\phi$ | $\pi+5\Delta\phi$ | $6\Delta\phi$ | $\pi+7\Delta\phi$ | $8\Delta\phi$ | $\pi+9\Delta\phi$ |
| Φ (n) | 0 | $\Delta\phi$ | $\pi+2\Delta\phi$ | $\pi+3\Delta\phi$ | $4\Delta\phi$ | $5\Delta\phi$ | $\pi+6\Delta\phi$ | $\pi+7\Delta\phi$ | $8\Delta\phi$ | $9\Delta\phi$ |
| θ (n) | 0 | $\pi$ | $\pi$ | 0 | 0 | $\pi$ | $\pi$ | 0 | 0 | $\pi$ |

FIG. 15

MRI APPARATUS AND MRI METHOD FOR SSFP WITH CENTER FREQUENCY AND 1ST ORDER GRADIENT MOMENTS ZEROED

BACKGROUND OF THE INVENTION

1. Field of the Invention

The present invention relates to a MRI (magnetic resonance imaging) apparatus and a magnetic resonance imaging method which excite nuclear spin of an object magnetically with a RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which acquires NMR signals with using SSFP (Steady State Free Precession).

2. Description of the Related Art

Magnetic Resonance Imaging is an imaging method which excites nuclear spin of an object set in a static magnetic field with a RF signal having the Larmor frequency magnetically and reconstruct an image based on NMR signals generated due to the excitation.

In the field of a magnetic resonance imaging, the imaging method using SSFP (Steady State Free Precession) has been known. As a typical example of high speed imaging sequence using SSFP, there is a sequence referred to TrueFISP (fast imaging with steady precession) (see, for example, U.S. Pat. No. 4,769,603).

FIG. 1 is a flowchart showing the conventional True FISP sequence.

As shown in FIG. 1, the conventional SSFP sequence such as the TrueFISP sequence applies a RF excitation pulse repeatedly at a constant and short TR (repetition time) with a same excitation angle (flip angle) α to lead magnetization in a steady state quickly. The gradient magnetic field is adjusted so that the zero-order moment (time integration) becomes zero. The gradient magnetic field in a read out axis direction is controlled so that the polarity inverts several times. As a result, an obtained echo signal has a high signal to noise ratio (SNR) and a signal intensity S depends on a relaxation time of a tissue as shown in the expression (1).

$$S \propto 1/(1+T1/T2) \quad (1)$$

Note that, the expression (1) is a relational expression when an excitation angle α is 90 degrees. T1 and T2 are a longitudinal relaxation time of a tissue and a transverse relaxation time of a tissue respectively. As shown in the expression (1), the intensity S of signal obtained by the SSFP sequence depends on a relaxation time ratio T1/T2 of a tissue. Consequently, it is known that it is the most effective from the contrast viewpoint to regard a cine image of a heart as an applicable target of the SSFP sequence. In addition, the effectiveness of the SSFP sequence to imaging of the abdominal vasculature has been pointed out.

In the meanwhile, the requirements needed for the SSFP sequence include requirements with regard to a phase of RF pulse in addition to the requirement that the zero-order moment of gradient magnetic field becomes zero as described above. The simplest control requirement with regard to a phase of RF pulse is that a phase of continuous RF pulse alternates between zero degree and 180 degrees (π radian).

FIG. 2 is a diagram showing a variation of magnetization intensity by a scan under the conventional SSFP sequence.

When an angle is controlled so that each excitation angle of continuous RF pulses becomes a, and a phase is controlled so that a phase of continuous RF pulse alternates between zero degree and 180 degrees, the magnetization state alternates between the state (A) and the state (B) as shown in a vectorial representation in FIG. 2.

That is, phases of excitation pulses are controlled so that:
the excitation angle becomes α, α, α, . . . ,
the phase of excitation pulse becomes 0°, 180°, 0°, . . . , and
the state of magnetization becomes (A), (B), (A), . . . .

As shown in FIG. 2, a magnetization that reached a steady state becomes the state (A) that deviates from the static magnetic field direction by α/2. In this state (A) of magnetization, when an excitation pulse with changing the phase by 180 degrees is applied, the magnetization state changes from the state (A) to the state (fl). Moreover, in the magnetization state (B), when an excitation pulse with changing the phase by 180 degrees is applied, the magnetization state returns from the state (B) to the state (A) again.

In this way, it turns out that a steady state is maintained effectively by changing a phase of a continuous excitation pulse by 180 degrees. It is also known that the time required for transferring magnetization in thermal equilibrium to a steady state can be reduced by the foregoing phase control of an excitation pulse.

FIG. 3 is a sequence chart showing a pulse sequence derived by improving the conventional tureFISP sequence.

As shown in FIG. 3, a pulse sequence for applying a pre-pulse with an excitation angle α/2 prior to a RF excitation pulse train applied at intervals of a TR with a same excitation angle α, which is derived by improving the conventional TrueFISP sequences has been also designed. A phase angle of the pre-pulse becomes 0 degree since it differs from the phase angle 180 degrees of the first RF excitation pulse by 180 degrees.

However, the control technique of the phase angles of excitation pulses in the conventional SSFP sequence is applicable to only the case where signals are acquired from a single matter having a certain chemical shift, and can achieve an effect only in the case in which the center frequency of the excitation pulse set as an imaging condition in the apparatus side is adjusted so as to become same as a resonance frequency of a matter to be an application target. Therefore, when the center frequency of the excitation pulse set in the apparatus side is off a resonance frequency of a matter to be an application target, a magnetization rotates about the static magnetic field direction in an interval between an application of a certain excitation pulse and the application of the next excitation pulse. In such a case, a state different from a steady state as shown in FIG. 2 will be generated.

Moreover, generally various materials exist in a living body and each matter has a specific chemical shift. The typical matters in a living body include water and fat component. Consequently, A water image where signals from water are emphasized or a fat image where signals from fat are emphasized are acquired frequently. Therefore, a contrast of an image acquired by a SSFP sequence changes significantly depending on which of a water image or a fat image is acquired. In addition, a contrast of an image acquired by a SSFP sequence also changes significantly depending on whether a center frequency of an excitation pulse set on the apparatus side is adjusted to match the resonance frequency of water or the resonance frequency of fat.

For this reason, when a center frequency of an excitation pulse is set to a resonance frequency of a matter different from a matter to be imaged, there is also a possibility that a steady state of magnetization is not maintained appropriately and an image can not be obtained with a desired contrast. And even if magnetization becomes a steady state, the time until the magnetization becomes the steady state becomes long and that leads to an increase of image artifacts such as ghost and blurring.

That is, there is a problem that a steady state of a magnetization is not maintained appropriately and an image with a satisfactory contrast can not obtained in case where a center frequency of an excitation pulse set as an imaging condition is not adjusted properly and becomes different from a resonance frequency of a matter to be a imaging target if the control technique of a phase angle of an excitation pulse in the conventional SSFP sequence is used.

FIG. 4 is a diagram showing a variation of magnetization in a matter under a method for controlling a phase angle of an excitation pulse based on the conventional SSFP sequence.

FIG. 4 is a diagram in which a transverse magnetization of a matter to be imaged in the XY direction is viewed from a static magnetic field direction in a system that rotates with a same frequency as the center frequency of an excitation pulse with respect to the laboratory system.

When a transverse magnetization of a matter turned to the (n) position shown in FIG. 4 by application of the n-th RF excitation pulse, the transverse magnetization rotates by $2\pi \cdot \Delta f \cdot TR$ immediately before application of the (n+1)-th RF excitation pulse in case where a center frequency of a RF excitation pulse differs from a resonance frequency of a matter to be imaged by $\Delta f$ [Hz]. Here, TR denotes a repetition time of a RF excitation pulse.

A phase angle of the (n+1)-th RF excitation pulse differs from a phase angle of the n-th RF excitation pulse by 160 degrees. Therefore, the transverse magnetization rotates into the (n+1) position shown in FIG. 4 immediately after the application of the (n+1)-th RF excitation pulse.

As described above, it turns out that a size of a transverse magnetization changes with each excitation and a steady state of magnetization is not maintained by the control technique of a phase angle of an excitation pulse based on the conventional SSFP sequence. And if a steady state of magnetization is not maintained. well, a signal intensity fluctuates and that leads to not only appearance of artifacts such as ghost and blurring but also change of a contrast itself of an image.

In addition, problems in the control technique of a phase angle of an excitation pulse in the conventional SSFP sequence include a possibility that a steady state of magnetization breaks due to a variable magnetic field in a static magnetic field. Representative examples of variable magnetic field include a B0 magnetic field, having a uniform spatial distribution, caused by an eddy current generated with a drive of a gradient magnetic field pulse and a B0 magnetic field generated by coupling of a gradient magnetic field coil or a shim coil and the static magnetic field magnet. When these B0 magnetic fields are generated, a magnetization is to rotate in the static magnetic field direction. As a result, a phase shift of magnetization, equivalent to that due to setting the center frequency of a RF excitation pulse to an inappropriate frequency, occurs.

That is, a magnetization starts a phase rotation around the static magnetic field in each TR due to a B0 magnetic field and the consistency in phase with a RF excitation pulse applied consecutively breaks up. Consequently, this leads to a change of a contrast of an image and generation of artifacts. This means there is a problem that a sufficient steady state of a magnetization can not be obtained in case where the influence of a B0 magnetic field is not negligible under the conventional control technique of a phase of an excitation pulse.

SUMMARY OF THE INVENTION

The present invention has been made in light of the conventional situations, and it is an object of the present invention to provide a magnetic resonance imaging apparatus and a magnetic resonance imaging method which make it possible to maintain a steady state of magnetization more satisfactorily even though there is a factor, such as an adjusting deviance in a center frequency of an excitation pulse and/or a B0 magnetic field, disturbing the steady state in case of acquiring data with using steady state free precession of the magnetization.

The present invention provides a magnetic resonance imaging apparatus comprising: an input unit configured to input information indicating a matter of which resonance frequency is a center frequency of an excitation pulse; a data acquisition unit configured to acquire magnetic resonance data with obtaining a steady state free precession of a magnetization in a desired matter by applying plural excitation pulses having a same flip angle with a constant repetition time and gradient magnetic fields to an object, the plural excitation pulses each having a transmission phase varying by a variation amount determined based on a difference between a resonance frequency of a desired matter and the center frequency defined depending on the matter; and an image generating unit configured to generate an image of the desired matter based on the magnetic resonance data, wherein respective zero order moments of gradient magnetic field from each application time of the plural excitation pulses till a center time of a corresponding echo and gradient magnetic field from each center time of echoes till an application time of a following excitation pulse included in the gradient magnetic fields are zeros in an aspect to achieve the object.

The present invention also provides a magnetic resonance imaging apparatus comprising: a data acquisition unit configured to acquire magnetic resonance data with obtaining a steady state free precession of a magnetization in a desired matter by applying plural excitation pulses having a same flip angle with a constant repetition time and gradient magnetic fields to an objects the plural excitation pulses each having a transmission phase varying by a variation amount determined based on a phase shift amount due to a fluctuation of a B0 magnetic filed; and an image generating unit configured to generate an image of the desired matter based on the magnetic resonance data, wherein respective zero order moments of gradient magnetic field from each application time of the plural excitation pulses till a center time of a corresponding echo and gradient magnetic field from each center time of echoes till an application time of a following excitation pulse included in the gradient magnetic fields are zero, in an aspect to achieve the object.

The present invention also provides a magnetic resonance imaging method comprising: inputting information indicating a matter of which resonance frequency is a center frequency of an excitation pulse; acquiring magnetic resonance data with obtaining a steady state free precession of a magnetization in a desired matter by applying plural excitation pulses having a same flip angle with a constant repetition time and gradient magnetic fields to an object, the plural excitation pulses each having a transmission phase varying by a variation amount determined based on a difference between a resonance frequency of a desired matter and the center frequency defined depending on the matter; and generating an image of the desired matter based on the magnetic resonance data, wherein respective zero order moments of gradient magnetic field from each application time of the plural excitation pulses till a center time of a corresponding echo and gradient magnetic field from each center time of echoes till an application time of a following excitation pulse included in the gradient magnetic fields are zero, in an aspect to achieve the object.

The present invention also provides a magnetic resonance imaging method comprising: acquiring magnetic resonance data with obtaining a steady state free precession of a magnetization in a desired matter by applying plural excitation pulses having a same flip angle with a constant repetition time and gradient magnetic fields to an object, the plural excitation pulses each having a transmission phase varying by a variation amount determined based on a phase shift amount due to a fluctuation of a B0 magnetic filed; and generating an image of the desired matter based on the magnetic resonance data, wherein respective zero order moments of gradient magnetic field from each application time of the plural excitation pulses till a center tine of a corresponding echo and gradient magnetic field from each center time of echoes till an application time of a following excitation pulse included in the gradient magnetic fields are zero, in an aspect to achieve the object.

The magnetic resonance imaging apparatus and the magnetic resonance imaging method according to the present invention as described above make it possible to maintain a steady state of magnetization more satisfactorily even though there is a factor, such as an adjusting deviance in a center frequency of an excitation pulse and/or a B0 magnetic field, disturbing the steady state in case of acquiring data with using steady state free precession of the magnetization.

BRIEF DESCRIPTION OF THE DRAWINGS

In the accompanying drawings:

FIG. 14 is a table showing an example of control amount in the receiver shown in FIG. 5 in case of controlling a phase Φ(n), for detection of reception signals acquired sequentially, depending on a phase φ(n) of a RF excitation pulse and inverting a part of phases θ(n) of the reception signals after A/D conversion;

FIG. 15 is a table showing an example of control amount in the receiver shown in FIG. 5 in case of controlling a phase Φ(n), for detection of reception signals acquired centrically, depending on a phase φ(n) of a RF excitation pulse and inverting a part of phases θ(n) of the reception signals after A/D conversion;

DESCRIPTION OF THE PREFERRED EMBODIMENTS

A magnetic resonance imaging apparatus and a magnetic resonance imaging method according to embodiments of the present invention will be described with reference to the accompanying drawings.

Figure 5:
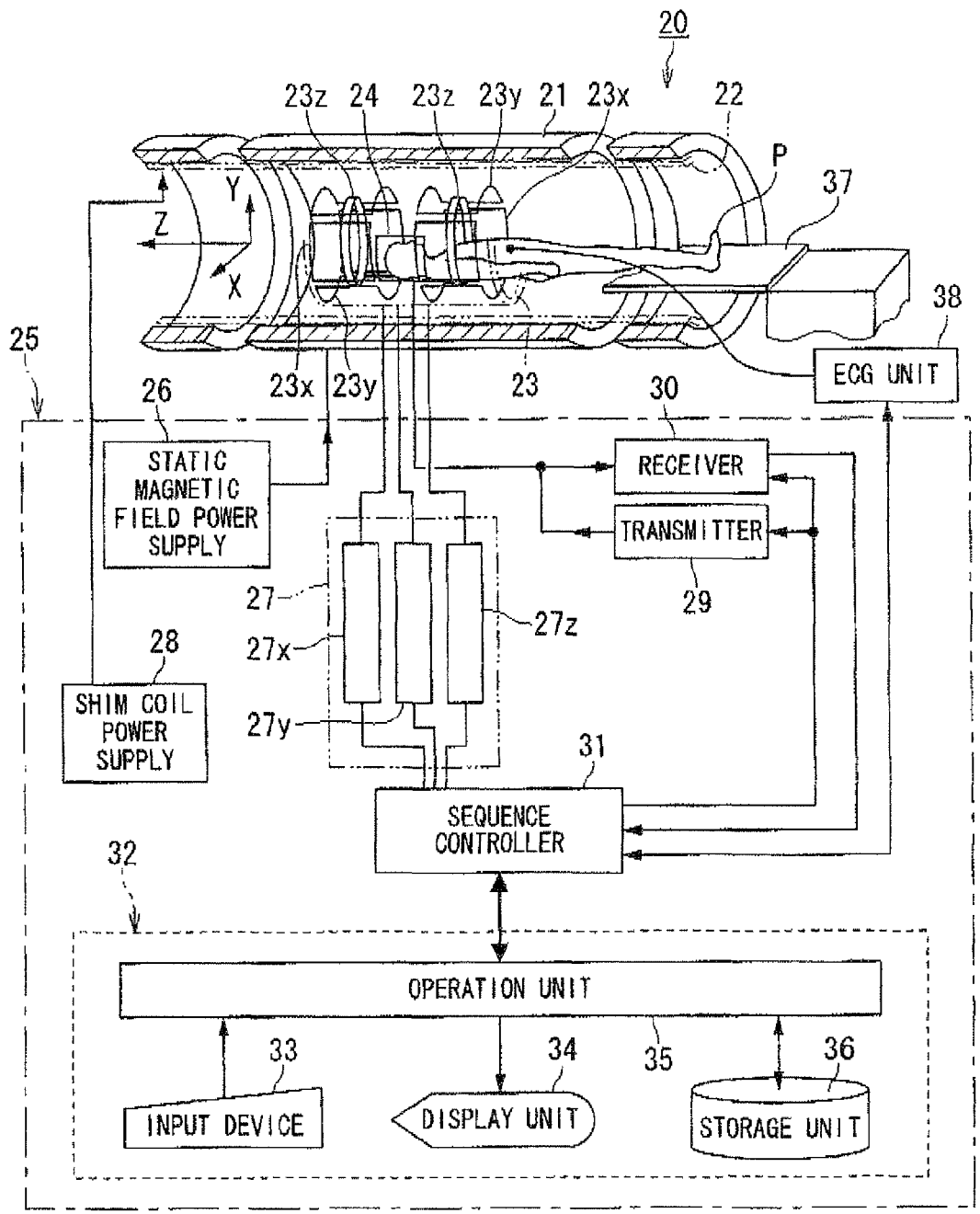
FIG. 5 is a block diagram showing a magnetic resonance imaging apparatus according to an embodiment of the present invention.

FIG. 5 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 271 The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z. directions in the imaging area.

The RF coil 24 communicates with the transmitter 29 and the receiver 30. The RF coil 24 has a function to transmit a RF signal given from the transmitter 29 to the object P and receive a NMR signal generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

In addition, an ECG unit 38 for acquiring an ECG signal of the object P is provided with the magnetic resonance imaging apparatus 20. The ECG signal detected by the ECG unit 38 is outputted to the computer 32 through the sequence controller 31.

Note that, a PPG (peripheral pulse gating) signal may be acquired instead of an ECG signal. A PPG signal is acquired by detecting a pulse wave of e.g. tip of a finger as an optical signal. When a PPG signal is acquired, a PPG signal detection unit is provided with the magnetic resonance imaging apparatus 20.

Thus, the magnetic resonance imaging apparatus 20 is configured to be able to perform a synchronous imaging as needed using an ECG signal or a PPG signal under the control of the computer 32.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 6:
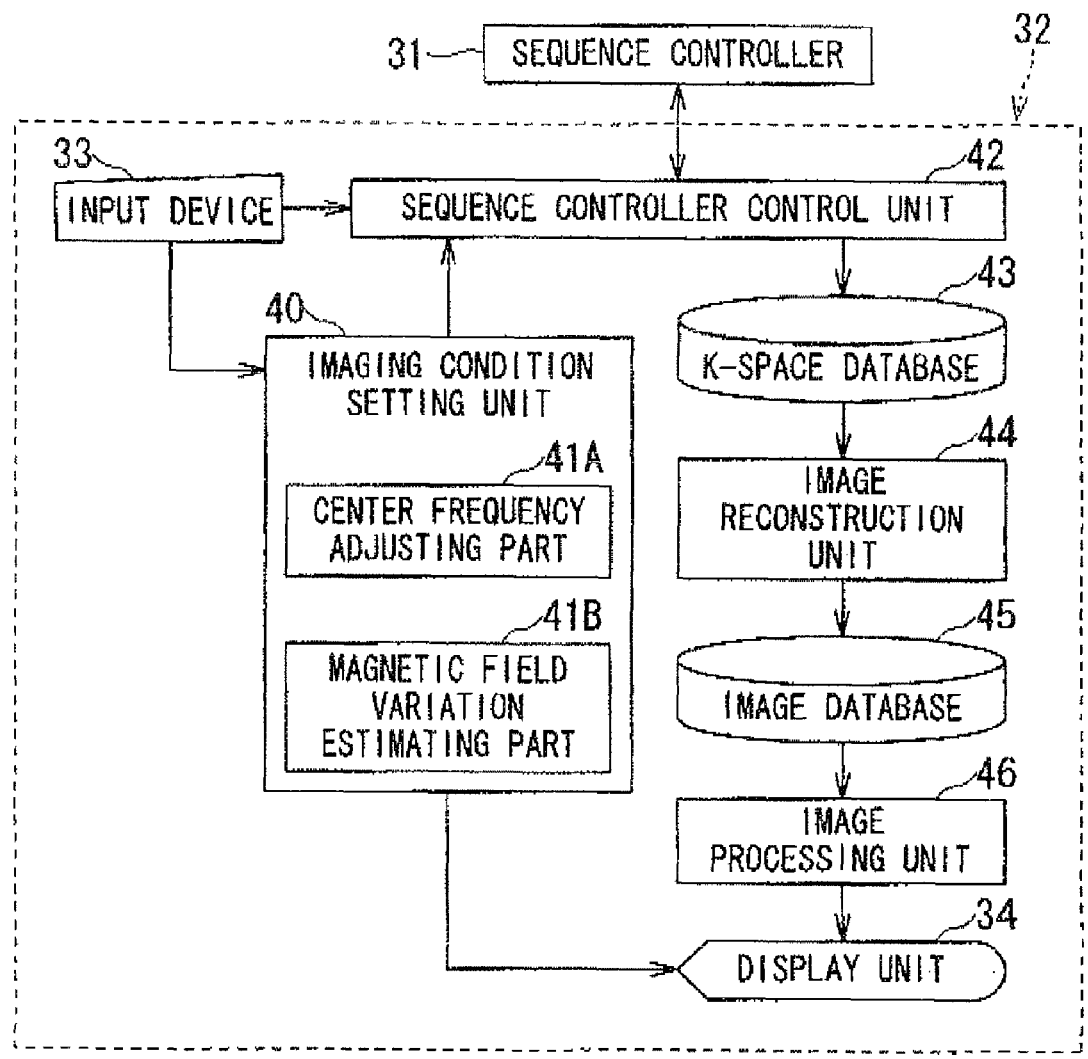
FIG. 6 is a functional block diagram of the computer shown in FIG. 5.

FIG. 6 is a functional block diagram of the computer 32 shown in FIG. 5.

The computer 32 functions as an imaging condition setting unit 40, a sequence controller control unit 42, a k-space database 43, an image reconstruction unit 44, an image database 45 and an image processing unit 46 by program. The imaging condition setting unit 40 includes a center frequency adjusting part 41A and a magnetic field variation estimating part 41B.

The imaging condition setting unit 40 has a function to set an imaging condition by using a SSFP sequence in which each phase angle of RF excitation pulses is controlled so that a difference in phase angle between adjacent RF excitation pulses becomes an angle different from 180 degrees and to provide the set imaging condition including the pulse sequence to the sequence controller control unit 42. Setting an imaging condition can be performed based on instruction information from the input device 33.

For that purpose, the imaging condition setting unit 40 has a function to display a setting screen of an imaging condition on the display unit 34. And a user can select an imaging protocol used for imaging from prepared plural imaging protocols corresponding to respective imaging parts and/or respective imaging conditions and set an imaging condition including necessary parameter values by performing the operation on the input device 33 with reference to a setting screen displayed on the display unit 34.

Figure 7:
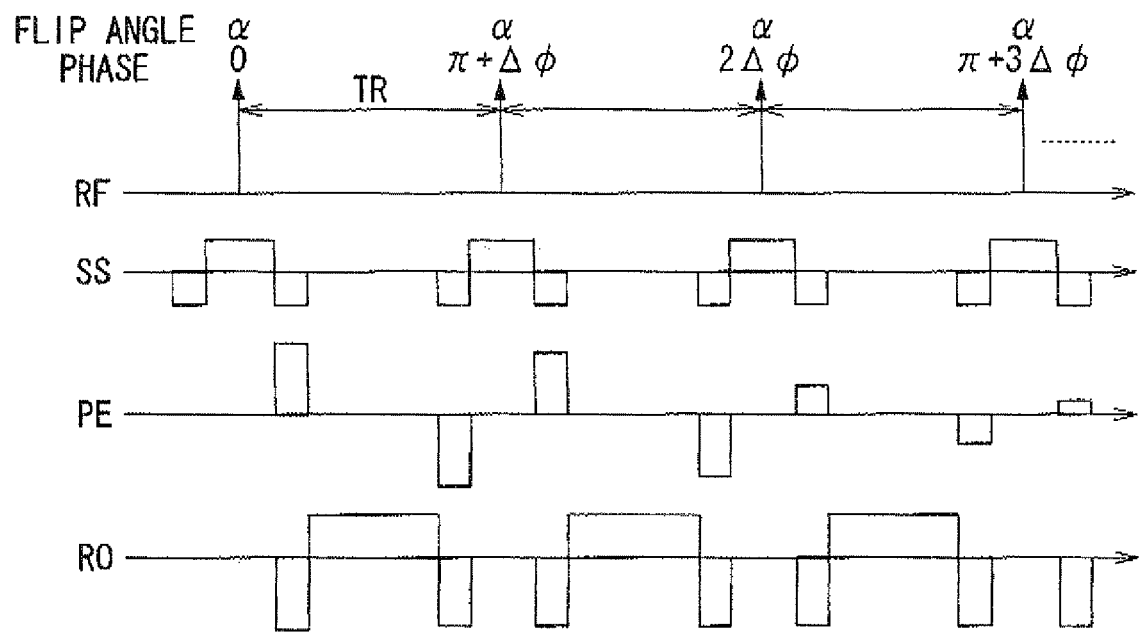
FIG. 7 is a diagram showing an example of SSFP sequence set by the imaging condition setting unit shown in FIG. 5.

FIG. 7 is a diagram showing an example of SSFP sequence set by the imaging condition setting unit 40 shown in FIG. 5.

In FIG. 7, RF denotes RF excitation pulses, SS denotes gradient magnetic field for slice selection in a slice axis direction, PE denotes gradient magnetic field for phase encode in a phase encode axis direction and RO denotes gradient magnetic field for readout in a readout axis direction.

As shown in FIG. 7, a SSFP sequence set in the imaging condition setting unit 40 is a sequence for applying RF excitation pulses having a same excitation angle (flip angle) $\alpha$ with a constant short TR so as to lead a magnetization into a steady state quickly The gradient magnetic field in each direction is controlled so that each of zero-order moments (area), which are integral values of gradient magnetic fields, from an application time of. a RF excitation pulse till a center time of the corresponding echo and from a center time of an echo till an application time of the next RF excitation pulse becomes zero. As a result, each of zero-order moments of gradient magnetic fields in triaxial directions including the slice axis, the phase encode axis and the readout axis becomes zero between a TR.

Moreover, in the SSFP sequence shown in FIG. 7, a phase angle of each RP excitation pulse is controlled so that a difference in phase angle between adjacent RF excitation pulses becomes a constant angle $\pi+\Delta\phi 1$ which is different from $\pi$ [radian] (180 degrees) This means a phase angle of each RF excitation pulse is controlled so that the relational expression shown in the expression (2) is formed when a phase angle of the n-th RF excitation pulse is denoted by $\phi(n)$ $$\phi(n+1)-\phi(n)=\pi+\Delta\phi 1 \text{ [radian]}$$

wherein $$\phi(n)\pm 2\pi=\phi(n) \tag{2}$$

In the expression (2), a shift amount Δφ1, from π, of a phase angle difference it between adjacent RF excitation pulses is determined based on a TR [second] of the RF excitation pulses and a subtraction value Δf [Hz] between a set center frequency of a RF excitation pulse to be and a resonance frequency of a matter to be imaged, as shown in the expression (3) for example.

$$\Delta\phi1=2\pi\cdot\Delta f\cdot TR \quad (3)$$

Specifically, a shift amount Δφ1 from π of a phase angle difference π between adjacent RF excitation pulses can be set to a value derived by multiplying 2π with a product of a TR of the RF excitation pulses and a subtraction value Δf between a set center frequency of a RI excitation pulse and a resonance frequency of a matter to be imaged. If each phase angle of the RF excitation pulses is controlled in this way, a steady state of a magnetization of a matter to be imaged can be maintained satisfactory even in a case where a center frequency of an RP excitation pulse is not adjusted well so as to exactly match to the resonance frequency of the matter to be imaged.

Figure 8:
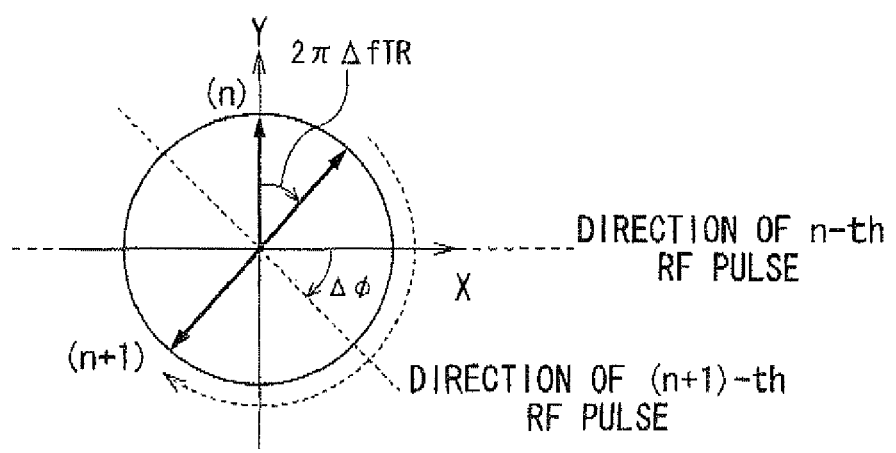
FIG. 8 is a diagram showing a behavior of a transverse magnetization in a matter in case of controlling each phase angle of the respective RF excitation pulses in the SSFP sequence as shown in FIG. 7.

FIG. 8 is a diagram showing a behavior of a transverse magnetization in a matter in case of controlling each phase angle of the respective RF excitation pulses in the SSFP sequence as shown in FIG. 7

FIG. 8 is a diagram in which a transverse magnetization of a matter to be imaged in the XY direction is viewed from a static magnetic field direction in a system that rotates with a same frequency as the center frequency of an excitation pulse with respect to the laboratory system.

When a transverse magnetization of a matter turned to the (n) position shown in FIG. 8 by application of the n-th RF excitation pulse, the transverse magnetization rotates by 2π·Δf·TR immediately before application of the (n+1)-th RF excitation pulse in case where a set center frequency of a RF excitation pulse differs from a resonance frequency of a matter to be imaged by a subtraction value Δf [Hz].

A phase angle of the (n+1)-th RF excitation pulse differs from a phase angle of the n-th RF excitation pulse by a phase angle difference π+Δφ1 and a shift amount Δφ1 from π of the phase angle difference π+Δφ1 is controlled so as to match to a rotation amount 2π·Δf·TR of the transverse magnetization depending on the subtraction value Δf between the center frequency of an excitation pulse and the resonance frequency of the matter. Consequently, the transverse magnetization rotates into the (n+1) position shown in FIG. 8 immediately after the application of the (n+1)-th RF excitation pulse.

As shown in FIG. 8, if the shift amount Δφ1 from π of the phase angle difference between adjacent RF excitation pulses is set to the rotation amount 2π·Δf·TR of the transverse magnetization due to the center frequency of the excitation pulse not being appropriately adjusted to the resonance frequency of the matter, it turns out that the size of the transverse magnetization becomes constant and a steady state of the transverse magnetization can be maintained.

Note that, only a behavior of the transverse magnetization is shown in FIG. 8 but the same holds true for that of a longitudinal magnetization. That is, if the shift amount Δφ1 from π of the phase angle difference between adjacent RF excitation pulses is set to a rotation amount of the longitudinal magnetization due to the center frequency of the excitation pulse not being appropriately adjusted to the resonance frequency of the matter, the size of the longitudinal magnetization also becomes constant and a steady state of the longitudinal magnetization can be maintained.

Figure 9:
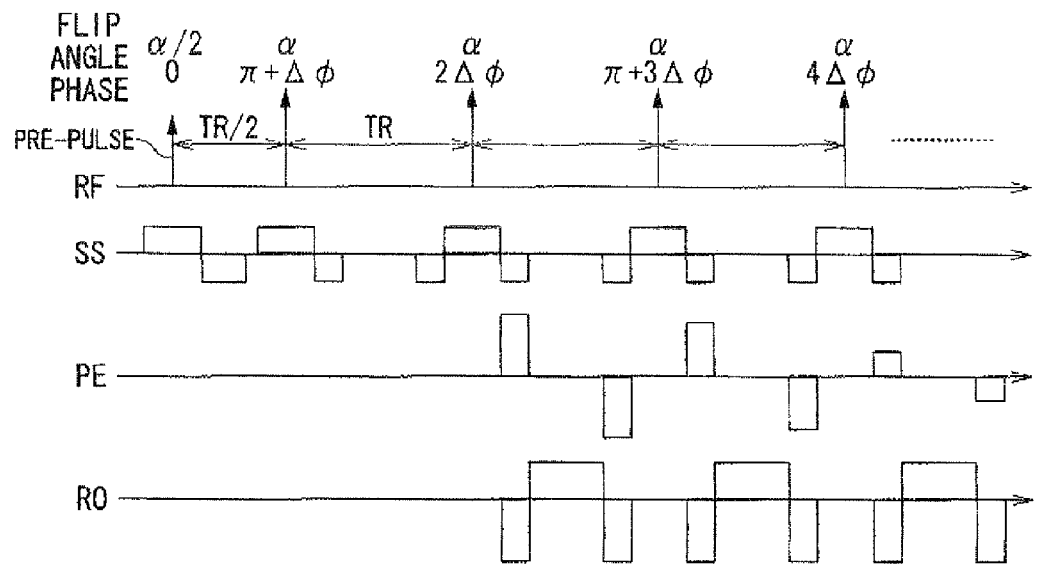
FIG. 9 is a diagram showing an example of SSFP sequence with applying an α/2 pre-pulse set by the imaging condition setting unit shown in FIG. 6.

FIG. 9 is a diagram showing an example of SSFP sequence with applying an α/2 pre-pulse set by the imaging condition setting unit 40 shown in FIG. 6.

In FIG. 9, RF denotes RF excitation pulses, SS denotes gradient magnetic field for slice selection in a slice axis direction, PE denotes gradient magnetic field for phase encode in a phase encode axis direction and RO denotes gradient magnetic field for readout in a readout axis direction.

A SSFP sequence as shown in FIG. 9 can be set so as to apply a pre-pulse having an excitation angle α/2 prior to the RF excitation pulse train having the excitation angle α applied at intervals of TRs in the SSFP sequence shown in FIG. 7. The SSFP sequence shown in FIG. 9 is also referred as a TrueFISP sequence.

As described above, when the α/2 pre-pulse is applied, it is preferable to control either or both of a phase angle φ(0) of the α/2 pre-pulse and a phase angle φ(1) of the first RF excitation pulse applied subsequent to the α/2 pre-pulse so that the relational expression shown in the expression (4) is formed, $$\phi(1)-\phi(0)=\pi+\Delta\phi1/2 \text{ [radian]} \quad (4)$$

That is, either or both of the phase angle φ(0) of the α/2 pre-pulse and the phase angle φ(1) of the first RF excitation pulse applied subsequent to the α/2 pre-pulse can be controlled so that a phase angle difference between the phase angle φ(0) of the α/2 pre-pulse and the phase angle φ(1) of the first RF excitation pulse applied subsequent to the α/2 pre-pulse becomes π+Δφ1/2. Hereat, it is preferable that a shift amount Δφ1 in phase angle is determined as the expression (3).

Hereat, in contrast to the expression (2) to control the phase angle difference between adjacent RF excitation pulses, 1/2 factor is multiplied by Δφ1 in the expression (4) This is because the time interval from the application time of the α/2 pre-pulse to the application time of the first RF excitation pulse applied subsequent to the α/2 pre-pulse is equal to TR/2 and a phase shift amount of magnetization occurring in the time interval TR/2 is 1/2 of the phase shift amount 2π·Δf·TR of magnetization occurring in the time interval TR between adjacent RP excitation pulses.

If either or both of the phase angle φ(0) of the α/2 pre-pulse and the phase angle φ(1) of the first RF excitation pulse is controlled so that the expressions (3) and (4) are satisfied, the phase angles of the α/2 pre-pulse and the RF excitation pulses can follow the phase shift amount of magnetization due to the center frequency of the excitation pulse not being appropriately adjusted to the resonance frequency of the matter. And magnetization can be transformed to a steady state sooner.

Figure 10:
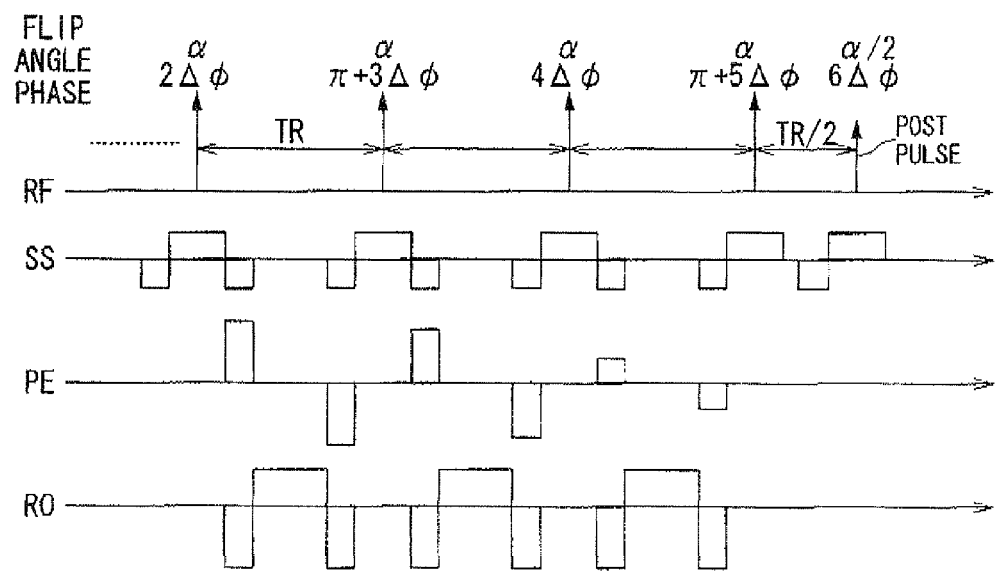
FIG. 10 is a diagram showing an example of SSFP sequence with applying an α/2 post-pulse set by the imaging condition setting unit shown in FIG. 6.

FIG. 10 is a diagram showing an example of SSFP sequence with applying an α/2 post-pulse set by the imaging condition setting unit 40 shown in FIG. 6.

In FIG. 10, RF denotes RF excitation pulses, SS denotes gradient magnetic field for slice selection in a slice axis direction, PE denotes gradient magnetic field for phase encode in a phase encode axis direction and RO denotes gradient magnetic field for readout in a readout axis direction.

A SSFP sequence as shown in FIG. 10 can be set so as to apply a post-pulse having an excitation angle α/2 at last subsequently to the RF excitation pulse train having the excitation angle α applied at intervals of TRs in the SSFP sequence shown in FIG. 7.

As described above, when the α/2 post-pulse is applied, it is preferable to control a phase angle φ(END) of the α/2 post-pulse so that the relational expression shown in the expression (5) is formed.

$$\phi(END)-\phi(N)=\Delta\phi1/2 \text{ [radian]} \quad (5)$$

In the expression (5), φ(N) denotes a phase angle of the last N-th RF excitation pulse. That is, the phase angle φ(END) of the α/2 post-pulse can be controlled so that a phase angle difference between the phase angle φ(END) of the α/2 post-pulse and the phase angle φ(N) of the N-th RF excitation pulse applied prior to the α/2 post-pulse becomes Δφ1/2. Hereat, it is preferable that a shift amount Δφ1 in phase angle is determined as the expression (3).

If the phase angle φ(END) of the α/2 post-pulse is controlled so that the expressions (3) and (5) are satisfied, the original effect of the α/2 post-pulse can be obtained well even in a case where a phase shift of the magnetization occurs duo to the center frequency of the excitation pulse not being appropriately adjusted to the resonance frequency of the matter. The α/2 post-pulse has a function to return a magnetization in a steady state into a longitudinal magnetization. Consequently, when data is acquired according to a sequence using the segment k-space method, a steady state of the magnetization can be maintained generally constant in each segment. This leads to the reduction of artifacts. Note that, the segment k-space method is a data acquisition method that segmentalizes the K-space (also referred as frequency space or Fourier space) by dividing the K-space into several regions and retrieves pieces of K-space data corresponding to the respective segments sequentially.

As described above, the phase angle φ(n) of the n-th RF excitation pulse, the phase angle φ(0) of the α/2 pre-pulse and the phase angle φ(END) of the α/2 post-pulse can be determined based on the shift amount Δφ1 of the phase angle difference from π between adjacent RF excitation pulses as shown in the expressions (2), (4) and (5) respectively. Moreover, in order to determine the shift amount Δφ1 from the phase angle difference from π between adjacent RF excitation pulses based on the expression (3), it becomes important to accurately obtain a subtraction value Δf [Hz] between the center frequency of RF excitation pulse and the resonance frequency of the matter to be imaged.

For that reason, the center frequency adjusting part 41A of the imaging condition setting unit 40 has the function to adjust a center frequency of a RF excitation pulse based on a signal intensity distribution with respect to a change in a resonance frequency of an object P acquired in advance, i.e., a frequency spectrum of magnetic resonance signals and/or information indicating a matter input from the input device 33 and to provide the center frequency of the RF excitation pulse determined by an adjustment to the imaging condition setting unit 40. In addition, the center frequency adjusting part 41A is configured to display a symbol indicating a position of a determined center frequency of RF excitation pulse together with a signal intensity distribution with respect to a change in a resonance frequency of an object P acquired in advance as a reference image on the display unit 34.

Figure 11:
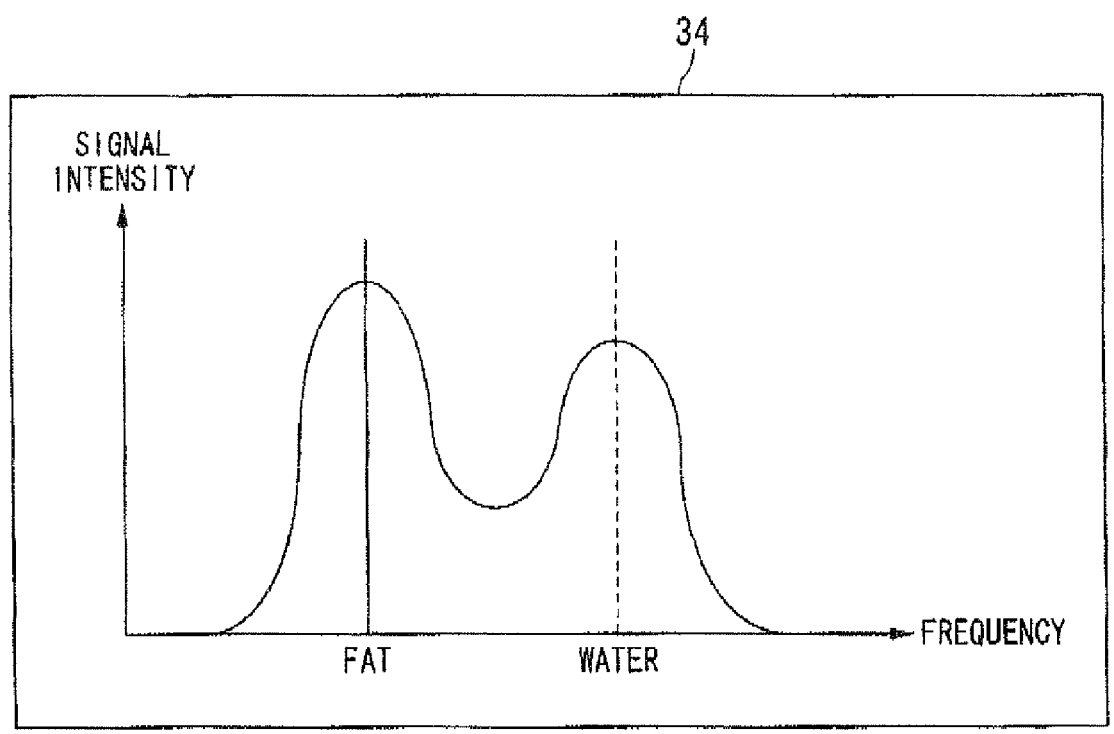
FIG. 11 is a diagram showing an example of reference image displayed on the display unit 34 by the center frequency adjusting part shown in FIG. 6.

FIG. 11 is a diagram showing an example of reference image displayed on the display unit 34 by the center frequency adjusting part 41A shown in FIG. 6.

In a graph in a reference image shown in FIG. 11, the abscissa axis denotes the frequencies and the ordinate axis denotes intensities of magnetic resonance signals. A frequency spectrum has respective peaks at the resonance frequencies of fat and water as shown in FIG. 11.

Generally, in a MRI apparatus for a human which images a human as an object, a center frequency of a RF excitation pulse is automatically-adjusted to a resonance frequency of a matter to be excited based on a frequency spectrum each time an object P is set on the MRI apparatus. For that reason, also in the magnetic resonance imaging apparatus 20 shown in FIG. 5, a center frequency of a RF excitation pulse is automatically-adjusted to a resonance frequency of a matter to be excited, based on a frequency spectrum as shown in FIG. 11, by the center frequency adjusting part 41A. Therefore, a center frequency of a RF excitation pulse does not become constant but becomes a different value for each object P.

However, a human consists basically of water and fat, and existence ratios of water and fat vary depending on a part of an object P and/or an individual difference between objects P. For this reason, a signal intensity might become the maximum value at the resonance frequency of water or fat depending on an imaging part. Therefore, though the chemical shift between water and fat is constant as about 3.5 ppm, the center frequency of a RF excitation pulse might be erroneously automatically-adjusted to the resonance frequency of water or fat not to be imaged (excited) in the center frequency adjusting part 41A. That is, the center frequency adjusting part 41A might recognize a peak of the resonance frequency of water on a resonance frequency spectrum of each object P as the resonance frequency of fat by mistake. On the contrary, the center frequency adjusting part 41A might recognize a peak of the resonance frequency of fat as the resonance frequency of water by mistake.

FIG. 11 shows an example where a peak of the resonance frequency of fat is recognized as the resonance frequency of water by mistake and a center frequency of a RF excitation pulse is automatically-adjusted to the resonance frequency of fat not to be excited.

A user can determine whether the center frequency adjusting part 41A has falsely recognized a resonance frequency by confirming visually whether a center frequency of a RF excitation pulse on a frequency spectrum displayed on the display unit 34 has been set to an appropriate frequency, for example.

However, it is also possible to determine whether a center frequency of a RF excitation pulse has been automatically-adjusted to a resonance frequency of a different matter by determining whether a signal intensity of fat or water is large or not at a data acquisition timing using the difference between T1 (longitudinal relaxation) times of water and fat. In this case, the center frequency adjusting part 41A is provided with a function to determine an error recognition of a resonance frequency.

Thus, a subtraction value Δf [Hz] between the center frequency of a RF excitation pulse and a resonance frequency of a matter to be imaged can be determined depending on whether the resonance frequency was erroneously recognized, namely whether the center frequency of the RF excitation pulse was adjusted to a resonance frequency of an incorrect matter. For that reason, the imaging condition setting unit 40 is provided with a function to determine a subtraction value Δf [Hz] between the center frequency of a RF excitation pulse and a resonance frequency of a matter to be imaged after receiving information about whether a resonance. frequency was erroneously recognized, from the input device 33.

Especially when a matter to be imaged is water or fat, information about whether an adjusted center frequency of a RF excitation pulse corresponds to the resonance frequency of water or fat, that is, information representing a matter of which resonance frequency is an automatically-adjusted center frequency of an excitation pulse, is input from the input device 33 to the imaging condition setting unit 40. Thus, the imaging condition setting unit 40 can determine a subtraction value Δf [Hz] between the center frequency of a RF excitation pulse and a resonance frequency of a matter to be imaged according to matter information input from the input device 33.

Note that, information representing an imaging part can be input instead of inputting a matter name directly as matter information arid a matter to be excited for imaging of a specified imaging part can be determined.

For example, when a matter to be imaged is water, center frequency adjustment result information that the adjusted center frequency f0 of the RF excitation pulse corresponds to the resonance frequency f1 of water can be input from the input device 33 to the imaging condition setting unit 40 in case where the center frequency f0 of the RF excitation pulse is adjusted to the resonance frequency f1 of water. Alternatively, matter information may not input from the input device 33 to the imaging condition setting unit 40. Then, the imaging condition setting unit 40 set a subtraction value Δf [Hz] between the center frequency f0 of a RF excitation pulse and the resonance frequency f1 of water to zero as shown in the expression (6).

$$\Delta f = 0 (f0 = f1) \quad (6)$$

On the contrary, when a matter to be imaged is water, center frequency adjustment result information that the adjusted center frequency f0 of the RF excitation pulse corresponds to the resonance frequency f2 of fat, i.e., the matter name of fat can be input from the input device 33 to the imaging condition setting unit 40 in case where the center frequency f0 of the RF excitation pulse is adjusted to the resonance frequency f2 of fat. Then, the imaging condition setting unit 40 set a subtraction value Δf [Hz] between the center frequency f0 of a RF excitation pulse and the resonance frequency f1 of water as shown in the expression (7).

$$\Delta f = -v \times f0 (f0 = f2) \quad (7)$$

In the expression (7), v denotes the difference value between the chemical shift of water and the chemical shift of fat. A value obtained by multiplying the difference value between the chemical shift of water and the chemical shift of fat by the center frequency f0 of a RF excitation pulse is set as the subtraction value Δf [Hz] between the center frequency f0 of the RF excitation pulse and the resonance frequency f1 of water.

If the subtraction value Δf [Hz] between the center frequency of A RF excitation pulse and a resonance frequency of a matter to be imaged is determined by the expressions (6) and (7) and the phase angle φ(n) of the n-th. RF excitation pulse, the phase angle φ(0) of the α/2 pre-pulse, and the phase angle φ(END) of the α/2 post-pulse are controlled using the determined subtraction value Δf [Hz] as shown in the expressions (2), (3), (4) and (5), respectively, a SSFP image of water with an improved contrast and less artifact can be obtained.

Note that, a SSFP image of water is often obtained with a normal MRI device, and, even when a SSFP image of fat is to be obtained, the subtraction value Δf [Hz] between the center frequency of a RF excitation pulse and a resonance frequency of a matter to be imaged can be determined similarly to a case of obtaining a SSFP image of water.

That is, when a matter to be imaged is fat and the center frequency f0 of a RF excitation pulse is adjusted to the resonance frequency f2 of fat, center frequency adjustment result information that the adjusted center frequency f0 of a RF excitation pulse corresponds to the resonance frequency f2 of fat can be input from the input device 33 to the imaging condition setting unit 40. Then, the imaging condition setting unit 40 set a subtraction value Δf [Hz] between the center frequency f0 of the RF excitation pulse and the resonance frequency f2 of fat to zero as shown in the expression (8).

$$\Delta f = 0 (f0 = f2) \quad (8)$$

On the contrary, when a matter to be imaged is fat and the center frequency f0 of a RF excitation pulse is adjusted to the resonance frequency f1 of water, center frequency adjustment result information that the adjusted center frequency f0 of a RF excitation pulse corresponds to the resonance frequency f1 of water can be input from the input device 33 to the imaging condition setting unit 40. Then, the imaging condition setting unit 40 set a subtraction value Δf [Hz] between the center frequency f0 of the RF excitation pulse and the resonance frequency f2 of fat as shown in the expression (9).

$$\Delta f = -v \times f0 (f0 = f1) \quad (9)$$

As described above, a SSFP image of a specific matter can be obtained satisfactorily by determining a subtraction value Δf [Hz] between the center frequency of a RF excitation pulse and a resonance frequency of a matter to be imaged.

However, a living body consists of various matters having mutually different chemical shifts, and therefore, acquisition of a SSFP image with respect to a various matter is desired. Especially, a SSFP image of water or fat existing much in a living body is frequently desired to be acquired. For that purpose, if a phase angle of a RF excitation pulse is controlled so that a shift amount Δφ1, from π, of a phase angle difference between adjacent RF excitation pulses satisfies the expression (10), signals from water and signals from fat can be acquired in a separable state respectively.

$$\Delta\phi 1 = 2\pi \cdot \Delta f \cdot TR \cdot m = 2\pi M \quad (10)$$

wherein m and M are integers. That is, when a subtraction value Δf [Hz] between the center frequency of a RF excitation pulse and the resonance frequency of water or fat is determined as described above, and either or both of an integer m and a TR are determined so that a shift amount Δφ1, from π, of a phase angle difference between adjacent RP excitation pulses becomes an integer times 2π, a phase difference between a signal from water and a signal from fat becomes 2π. This makes it possible to acquire water signals and fat signals in a separable state and to generate a SSFP image of water and a SSFP image of fat. As described above, if at least one of an integer m and a TR is adjusted so that a magnetization of at least one matter rotates i (i is an integer) times, signals from the matter can be acquired in a state separable from signals from the other matters.

So far, a method for determining a difference between a phase angle φ(n) of the n-th RF excitation pulse and a phase angle φ(n+1) of the (n+1)-th RF excitation pulse based on a subtraction value Δf [Hz] between a resonance frequency of a matter to be imaged and the center frequency of a RF excitation pulse has been described. However, a phase angle difference of RF excitation pulses can be determined depending on a position of an excited slice in case where a resonance frequency of a matter to be imaged varies spatially.

Further, a difference between a phase angle φ(n) of the n-th RF excitation pulse and a phase angle φ(n+1) of the (n+1)-th RF excitation pulse can be determined based on a variation amount of a B0 magnetic field. If a difference between a phase angle φ(n) of the n-th RF excitation pulse and a phase angle φ(n+1) of the (n+1)-th RF excitation pulse is determined based on a variation amount of a B0 magnetic field, a steady state of a magnetization can be maintained satisfactorily with avoiding influence due to a variation of the B0 magnetic field even in a case where the B0 magnetic field changed.

Variable B0 magnetic fields having a uniform spatial distribution include a B0 magnetic field created by an eddy current generated together with application of a gradient magnetic field pulse and a B0 magnetic field generated by coupling between the gradient magnetic field coil 23 or the shim coil 22 and the static magnetic field magnet 21. When a B0 magnetic field with variation as described above are generated, a magnetization rotates in the static magnetic field direction and there is a possibility that a steady state of the magnetization can not obtained sufficiently by the conventional phase control.

For that reason, the imaging condition setting unit 40 is provided with a function to control a phase angle of a RF excitation pulse based on a variation of a B0 magnetic field so that a steady state of a magnetization is maintained satisfactorily even if the B0 magnetic field changed. For that purpose, the magnetic field variation estimating part 41B of the imaging condition setting unit 40 has the function to estimate a variation amount of a B0 magnetic field based on a schedule for performing a pulse sequence. A method for estimating a variation of a B0 magnetic field is different depending on a mechanism generating the B0 magnetic field. Here, a method for estimating a variation amount of a B0 magnetic field caused by an eddy current generated with application of a gradient magnetic field pulse will be described. Estimating a variation amount of a B0 magnetic field caused by another mechanism can be considered to be similarly to estimation of a variation amount of a B0 magnetic field caused by application of a gradient magnetic field pulse.

Figure 12:
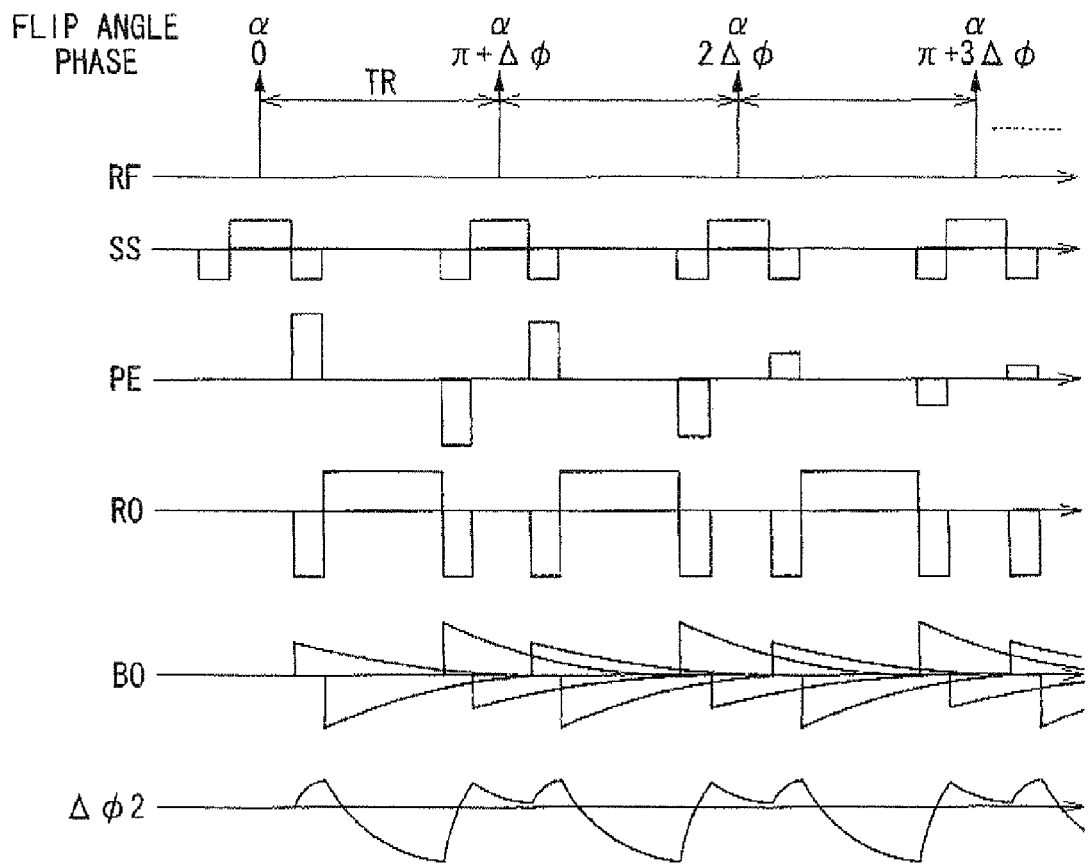
FIG. 12 is a diagram showing a pulse sequence set by the imaging condition setting unit shown in FIG. 6, a fluctuation amount of a B0 magnetic field estimated based on a performing schedule of the pulse sequence and a phase shift amount of a magnetization due to the fluctuation in the B0 magnetic field.

FIG. 12 is a diagram showing a pulse sequence set by the imaging condition setting unit 40 shown in FIG. 6, a fluctuation amount of a B0 magnetic field estimated based on a performing schedule of the pulse sequence and a phase shift amount of a magnetization due to the fluctuation in the B0 magnetic field.

In FIG. 12, RF denotes RF excitation pulses, SS denotes gradient magnetic field for slice selection in a slice axis direction, PE denotes gradient magnetic field for phase encode in a phase encode axis direction, RO denotes gradient magnetic field for readout in a readout axis direction, B0 denotes a fluctuation amount of a B0 magnetic field due to the applied gradient magnetic field pulses for readout and Δϕ2 denotes a phase shift amount of a magnetization due to the fluctuation in the B0 magnetic field.

As shown in FIG. 12, when a SSFP sequence is performed and a gradient magnetic field in a readout axis direction changes by applying gradient magnetic field pulses for readout, the B0 magnetic field fluctuates in a direction to cancel the change of the gradient magnetic field in the readout axis direction, namely, in a reverse polarity direction by an amount according to the variation amount of the gradient magnetic field. Then, the varied B0 magnetic field attenuates. And a phase of a magnetization shifts to the same polarity side as that of the B0 magnetic field due to the variation of the B0 magnetic field.

Note that, the variation amount of the B0 magnetic field and the phase shift amount of the magnetization caused by application of the readout gradient magnetic field pulses are shown in FIG. 12 for simplicity. However, a similar variation of the B0 magnetic field and a similar phase shift of a magnetization also occur due to application of other gradient magnetic field pulses.

When a schedule for performing gradient magnetic field pulses in a SSFP sequence as shown in FIG. 12 is denoted by G(t), and Laplace transform of the schedule G(t) for performing the gradient magnetic field pulses is denoted by g(s), a variation amount B0(t) of the B0 magnetic field at a time t can be represent as the expression (11).

$$B0(t) = L^{-1}\{H(s) \times g(s)\} \quad (11)$$

wherein H(s) denotes an impulse response of the B0 magnetic field to application of a gradient magnetic field pulse and $L^{-1}$ denotes the inverse Laplace transform.

Moreover, it is assumed that the n-th RF excitation pulse and the (n+1)-th RF excitation pulse are applied at t=T(n) and t=T(n+1) respectively, a phase shift amount Δϕ2(n+1) of a magnetization occurring between application of the n-th RF excitation pulse and application of the (n+1)-th RF excitation pulse can be calculated as the expression (12) using a variation amount B0(t) of the BC magnetic field, $$\Delta\phi 2(n+1) = \int_{T(n)}^{T(n+1)} \gamma B0(t)\,dt \quad (12)$$

That is, as shown in the expressions (11) and (12), a variation amount B0(t) of the B0 magnetic field can be estimated based on a schedule G(t) for performing gradient magnetic field pulses and a phase shift amount Δϕ2 in a magnetization between adjacent RF excitation pulses can be calculated based on the estimated variation amount B0(t) of the B0 magnetic field. For that reason, the imaging condition setting unit 40 is configured to calculate a phase shift amount Δϕ2 of a magnetization between adjacent RF excitation pulses based on a variation amount B0(t) of the B0 magnetic field estimated in the magnetic field variation estimating part 41B and to control a phase angle of a RF excitation pulse using the calculated phase shift amount Δϕ2 of the magnetization.

A phase angle of a RF excitation pulse can be controlled so as to satisfy the expression (13) like as the expression (2).

$$\phi(n+1) - \phi(n) = \pi + \Delta\phi 2(n+1) \text{ [radian]} \quad (13)$$

Specifically, a phase angle of each RF excitation pulse is controlled so that a phase angle difference between adjacent RF excitation pulses. becomes an angle π+Δϕ2(n+1) that is different from π.

Moreover, a phase angle of each RF excitation pulse can be controlled based on both a variation amount B0(t) of the B0 magnetic field and a subtraction value Δf [Hz] between the center frequency of a RF excitation pulse and a resonance frequency of a matter to be imaged. In this case, as shown in the expression (14), a phase angle difference between adjacent RF excitation pulses is controlled by using both a phase shift amount Δϕ1 determined based on a subtract ion value Δf [Hz] between the center frequency of a RP excitation pulse and a resonance frequency of a matter to be imaged and a phase shift amount Δϕ2 determined based on a variation amount B0(t) of the B0 magnetic field, $$\phi(n+1) - \phi(n) = \pi + \Delta\phi 1 + \Delta\phi 2(n+1) \text{ [radian]} \quad (14)$$

By controlling a phase angle of each RF excitation pulse as described above, a steady state of a magnetization can be maintained more satisfactorily even if there is factors that disturb the steady state of the magnetization such as a deviation of the center frequency of a RF excitation pulse from a resonance frequency and/or a B0 magnetic field.

However, by phase cycling of a RF excitation pulse as described above, a transverse magnetization, namely phases of acquired signals also fluctuate. Therefore, it is preferable to compensate phases of acquired signals before image reconstruction processing for generating images is performed on the signals. For that purpose, it is preferable that the receiver 30 is provided with the function to compensate phases of reception signals.

Figure 13:
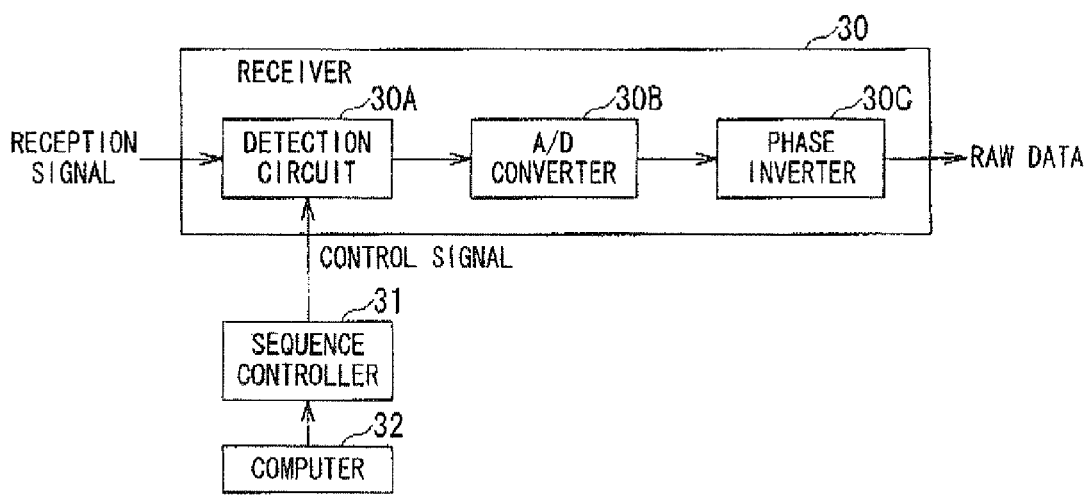
FIG. 13 is a diagram showing an example of detail circuit configuration of the receiver shown in FIG. 5.

FIG. 13 is a diagram showing an example of detail circuit configuration of the receiver 30 shown in FIG. 5.

As shown in FIG. 13, the receiver 30 has a detection circuit 30A, an A/D converter 30B and a phase inverter 30C. Note that, in FIG. 13, illustration and explanation as for other components, in the receiver 30, unrelated to compensation phases of reception signals are omitted.

Detection and A/D conversion of a NMR reception signal received from the RF coil 24 are performed in the receiver 30 as described above. Detection of a reception signal is performed in the detection circuit 30A and A/D conversion is performed on a reception signal after detection in the A/D converter 30B. For that reason, in order to compensate a phase of a reception signal, it is only necessary to control a phase $\phi(n)$ for detection depending on a phase $\phi(n)$ of a RF excitation pulse. For that purpose, the detection circuit 30A is configured to be provided with a phase $\phi(n)$ of a RF excitation pulse from the imaging condition setting unit 40 of the computer 32 through the sequence controller 31. Then, the detection circuit 30A sets a phase $\Phi(n)$ for detecting a reception signal so that a phase fluctuated depending on a phase $\phi(n)$ of a RF excitation pulse is compensated. This means a phase $\Phi(n)$ for detection by the detection circuit 30A is controlled by a control signal from the computer 32.

Though A/D conversion is performed on detected reception signals, DC (Direct Current) component of the receiving system generally mixes in the reception signals during A/D conversion. Consequently, a control that a phase $\theta(n)$ of a reception signal having two components after A/D conversion is inverted as needed so as to transfer artifacts caused by mixing DC component to an edge of an image is generally performed. This inversion processing of a phase $\theta(n)$ of a reception signal after A/D conversion is performed in the phase inverter 30C. Then, reception signals after the phase inversion processing are output as raw data from the receiver 30. For this reason, a phase $\Phi(n)$ for detecting a reception signal in the detection circuit 30A is also determined depending on the phase inversion processing in the phase inverter 30C.

FIG. 14 is a table showing an example of control amount in the receiver 30 shown in FIG. 5 in case of controlling a phase $\Phi(n)$, for detection of reception signals acquired sequentially, depending on a phase $\phi(n)$ of a RF excitation pulse and inverting a part of phases $\theta(n)$ of the reception signals after A/D conversion. FIG. 15 is a table showing an example of control amount in the receiver 30 shown in FIG. 5 in case of controlling a phase $\Phi(n)$, for detection of reception signals acquired centrically, depending on a phase $\phi(n)$ of a RF excitation pulse and inverting a part of phases $\theta(n)$ of the reception signals after A/D conversion.

In each of FIGS. 14 and 15, n denotes an order for acquiring a reception signal, PE(n) denotes a phase encode number to which the n-th acquired reception signal corresponds, $\phi(n)$ denotes a phase angle of a RF excitation pulse corresponding to the n-th acquired reception signal, $\Phi(n)$ denotes a phase for detection of the n-th acquired reception signal and $\theta(n)$ denotes a phase of the n-th reception signal after A/D conversion.

As shown in FIGS. 14 and 15, a phase $\theta(n)$ of each reception signal after A/D conversion depends on a phase encode number PE(n) and differs by $\pi$ depending on whether the phase encode number PE(n) is an even number or an odd number. Specifically, a phase $\theta(n)$ of a reception signal of which the phase encode number PE(n) is even is inverted as against a phase $\theta(n)$ of a reception signal of which the phase encode number PE(n) is odd.

Hereat, when the number of a matrix for phase encode is denoted by Npe (even number), the phase encode number PE(n) becomes PE(n)=0 for a reception signal in the center of the K space, and becomes PE(n)=−Npe/2 and PE(n)=Npe/2−1 for reception signals at both ends of the K space respectively.

A phase angle $\phi(n)$ of a RF excitation pulse depends on the number Nex of the RF excitation pulses after the start of excitation as described above. Generally, a magnetization has not sufficiently changed to a steady state immediately after the start of excitation. For this reason, dummy RF excitation pulses are applied. Therefore, the number N of a reception signal number n is calculated by subtracting the number Ndummy of dummy RF excitation pulses from the number Nex of the RF excitation pulses after the start of excitation as shown in the expression (15).

$$N=Nex-Ndummy \quad (15)$$

A phase $\Phi(n)$ for detecting a reception signal to be controlled is determined depending on a phase angle $\phi(n)$ of a RF excitation pulse and a phase $\theta(n)$ of the reception signal after A/D conversion. Accordingly, a phase $\Phi(n)$ for detecting a reception signal, a phase angle $\phi(n)$ of a RF excitation pulse and a phase $\theta(n)$ of the reception signal after A/D conversion eventually depend on an order of phase. Therefore, a phase $\Phi(n)$ of detecting a reception signal differs between the sequential acquisition shown in FIG. 14 and the centric acquisition shown in FIG. 15.

Note that, although each of FIG. 14 and FIG. 15 shows an example of case where signals are acquired without segmentation by the segment k-space method and the number Npe of a matrix for phase encode is 10, a phase $\Phi(n)$ for detecting a reception signal, a phase angle $\phi(n)$ of a RF excitation pulse and a phase $\theta(n)$ of the reception signal after A/D conversion can be determined regularly in the same way in case of performing segmentation or acquiring signals by a signal acquisition method according to an arbitrary phase encode order.

Then, by compensating a phase of a reception signal with controlling a phase $\Phi(n)$ for detecting the reception signal as described above, not only a steady state of a magnetization can be effectively maintained but an image in which DC artifacts are removed can be obtained.

Then, other functions of the computer 32 will be described.

The sequence controller control unit 42 has a function for controlling the driving of the sequence controller 31 by giving an imaging condition including a SSFP sequence acquired from the imaging condition setting unit 40 to the sequence controller 31 in response to information instructing scan start from the input device 33. In addition, the sequence controller control unit 42 has a function for receiving raw data from the sequence controller 31 and arranging the raw data to k space formed in the k-space database 43. Therefore, the k-space database 43 stores the raw data generated by the receiver 30 as k space data. That is, k-space data is arranged in the k-space formed in the k-space database 43.

The image reconstruction unit 44 has a function for reconstructing image data of an object P, which is real space data, from k-space data by capturing the k-space data from the k-space database 43 and performing image reconstruction processing including PT (Fourier transform) of the k-space data, and writing the reconstructed image data to the image database 45. Therefore, the image database 45 stores the image data reconstructed by the image reconstruction unit 44.

The image processing unit 46 has a function for generating image data for displaying by performing image processing such as subtraction processing and/or MIP processing of necessary image data read from the image database 45 and displaying an image on the display unit 34 by supplying the generated image data for displaying to the display unit 34.

Then, the operation and action of a magnetic resonance imaging apparatus 20 will be described.

Figure 1:
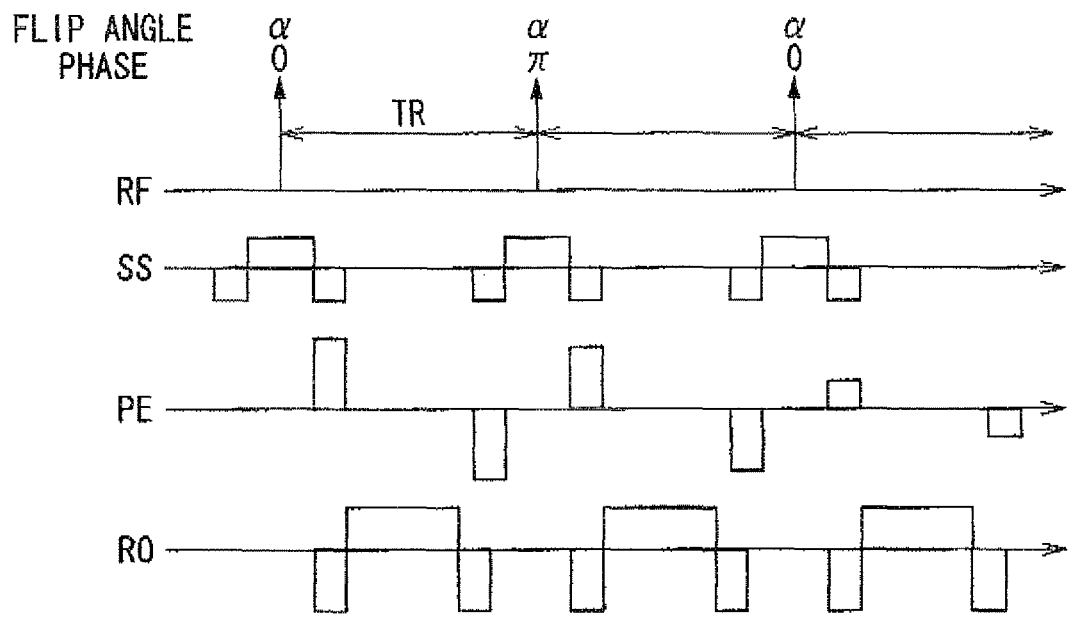
FIG. 1 is a flowchart showing the conventional True FISP sequence.
Figure 2:
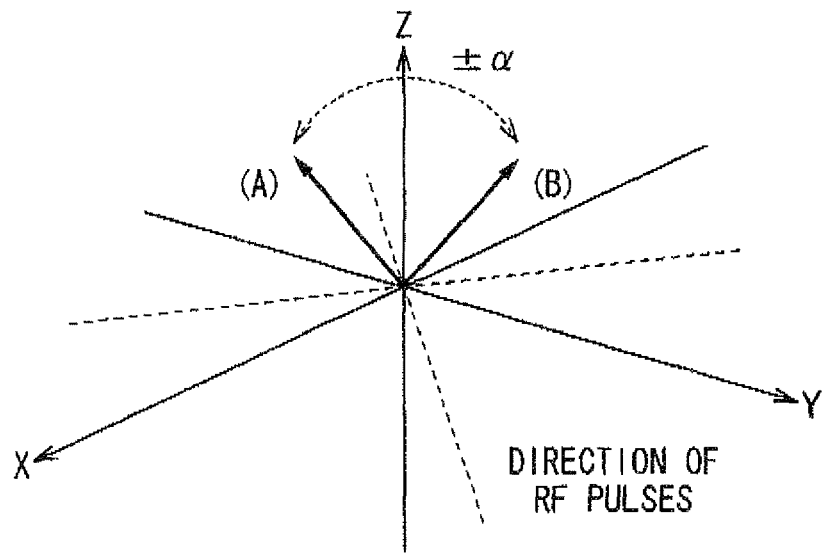
FIG. 2 is a diagram showing a variation of magnetization intensity by a scan under the conventional SSFP sequence.
Figure 3:
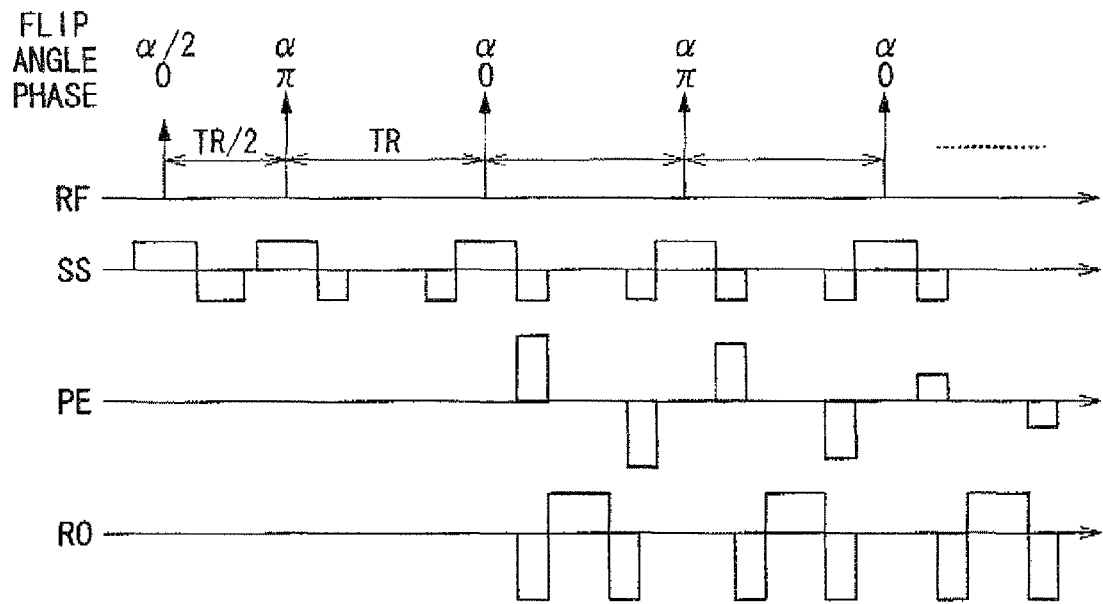
FIG. 3 is a sequence chart showing a pulse sequence derived by improving the conventional tureFISP sequence.
Figure 4:
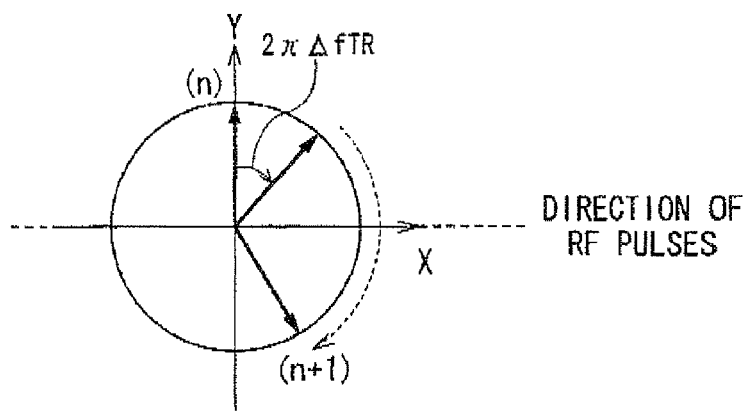
FIG. 4 is a diagram showing a variation of magnetization in a matter under a method for controlling a phase angle of an excitation pulse based on the conventional SSFP sequence.
Figure 16:
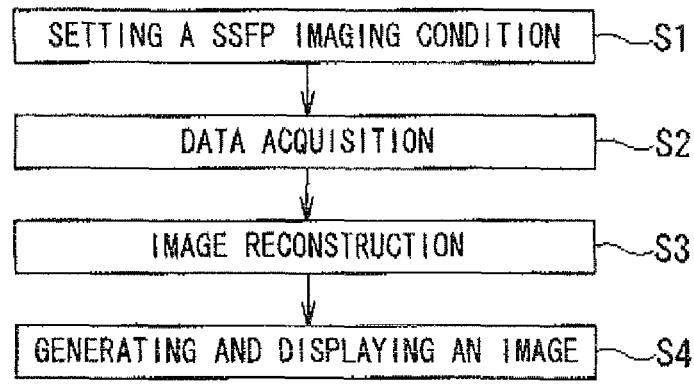
FIG. 16 is a flowchart showing a procedure for acquiring an image of the object with the magnetic resonance imaging apparatus shown in FIG. 1.

FIG. 16 is a flowchart showing a procedure for acquiring an image of the object P with the magnetic resonance imaging apparatus 20 shown in FIG. 1. The symbols including S with a number in FIG. 16 indicate each step of the flowchart.

First, in step S1, an imaging condition with a SSFP sequence is set in the imaging condition setting unit 40. Setting the imaging condition can be performed simply only by referring to a setting screen displayed on the display unit 34, selecting an imaging protocol for imaging from plural prepared imaging protocols for imaging parts and/or imaging conditions with operating the input device 33 and inputting necessary parameters.

Especially, a phase angle of a RF excitation pulse is set as described above using either or both of a phase shift amount $\Delta\phi1$ determined based on a subtraction value $\Delta f$ [Hz] between the center frequency of the RF excitation pulse and a resonance frequency of a matter to be imaged and a phase shift amount $\Delta\phi2$ determined based on a variation amount B0(t) of a B0 magnetic field.

When a phase angle of a RF excitation pulse is controlled based on a subtraction value $\Delta f$ [Hz] between a center frequency of a RF excitation pulse and a resonance frequency of a matter to be imaged, a frequency spectrum showing signal intensities of signals acquired in advance from the object P by arbitrary means such as a pre-scan previously to setting the imaging condition is obtained. Then, a phase shift amount $\Delta\phi1$ is obtained based on the subtraction value $\Delta f$ [Hz] between the center frequency of the RF excitation pulse automatically adjusted based on the obtained frequency spectrum and the resonance frequency of the matter to be imaged.

Figure 17:
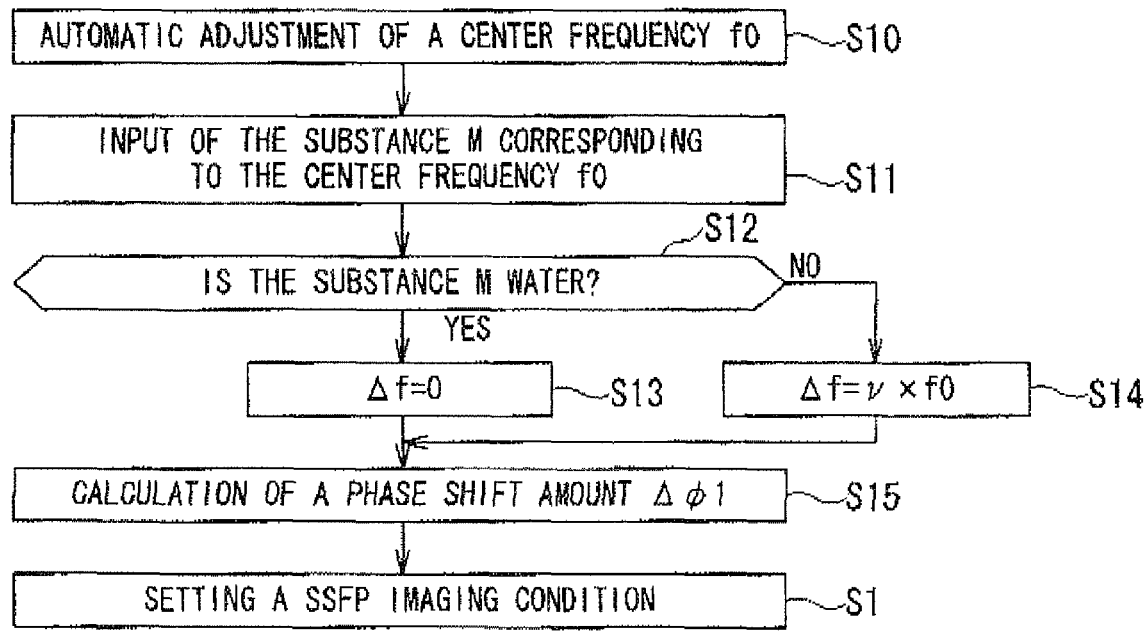
FIG. 17 is a flowchart showing a method for calculating a phase shift amount when automatically adjusting a center frequency of a RF excitation pulse to the resonance frequency of water.

FIG. 17 is a flowchart showing a method for calculating a phase shift amount $\Delta\phi1$ in case of automatically-adjusting a center frequency of a RF excitation pulse so as to match with the resonance frequency of water by the magnetic resonance imaging apparatus 20 shown in FIG. 1. The symbols including S with a number in FIG. 17 indicate each step of the flowchart. Note that, a case of acquiring a SSFP image of water will be described here.

First in step S10, one peak is detected from a frequency spectrum with regard to the object P by the center frequency adjusting part 41A and a center frequency f0 of a RF excitation pulse is automatically-adjusted to the frequency corresponding to the peak. The automatically-adjusted center frequency f0 of the RF excitation pulse and the frequency spectrum are output from the center frequency adjusting part 41A to the display unit 34, and the center frequency f0 of the RF excitation pulse is displayed together with the frequency spectrum on the display unit 34.

Then in step S11, a user looks the display unit 34 and specifies a matter M of which the resonance frequency is the automatically-adjusted center frequency f0 of the RF excitation pulse by operating the input device 33. The selection information of the specified matter N, i.e., water or fat, is provided from the input device 33 to the imaging condition setting unit 40 as center frequency adjustment result information.

Then in step 312, the imaging condition setting unit 40 determines whether the specified matter M is water or not.

Then, when the specified matter M is water, the imaging condition setting unit 40 sets a subtraction value $\Delta f$ [Hz] between the center frequency of the RF excitation pulse and the resonance frequency of the matter to be imaged to zero in step S13 since proper adjustment of the center frequency f0 has been performed. On the contrary, when the specified matter M is not water, the imaging condition setting unit 40 sets a value obtained by multiplying the difference value v between the chemical shift of water and the chemical shift of fat by the center frequency f0 of the RF excitation pulse as a subtraction value $\Delta f$ [Hz] between the center frequency of the RF excitation pulse and the resonance frequency of the matter to be imaged as shown in the expression (7) in step S14.

Then in step S15, the imaging condition setting unit 40 calculates a phase shift amount $\Delta\phi1$ based on the subtraction value $\Delta f$ [Hz] between the center frequency of the RF excitation pulse and the resonance frequency of the matter to be imaged as shown in the expression (3).

Them, by using the phase shift amount $\Delta\phi1$ calculated like this, an imaging condition with a SSFP sequence is set in step S1 as described above.

On the other hands, when a phase angle of a RF excitation pulse based on a variation amount B0(t) of a B0 magnetic field is controlled, the variation amount B0(t) of the B0 magnetic field is estimated based on a schedule for performing a pulse sequence by the magnetic field variation estimating part 413, for example by the expression (11) Subsequently, the imaging condition setting unit 40 calculates a phase shift amount $\Delta\phi2$ of a RF excitation pulse based on the estimated variation amount B0(t) of the B0 magnetic field. Then, by using the calculated phase shift amount $\Delta\phi2$, an imaging condition with a SSFP sequence is set in step S1 as described above.

Subsequently, in step S2 shown in FIG. 16, data acquisition is performed according to the set imaging condition.

For that purpose, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction of imaging start to the sequence controller control unit 42. The sequence controller control unit 42 supplies the imaging condition using the SSFP sequence received from the imaging condition setting unit 40 to the sequence controller 31. Therefore, the sequence controller 31 drives the gradient power supply 27, the transmitter 29, and the receiver 30 in accordance with the imaging condition received from the sequence controller control unit 42, thereby generating gradient magnetic fields in the imaging area having the set object P, and further generating RF signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 42. The sequence controller control unit 42 arranges the raw data as k-space data to the k space formed in the k-space database 42.

Note that, a phase for detection is controlled depending on a transmission phase angle of a RF excitation pulse in the receiver 30 so that a phase of each reception signal varying due to phase cycling is compensated. In addition, the phase inversion processing is performed on reception signals after A/D conversion so that artifacts caused by mixed DC component are transferred to an edge of an image.

Subsequently, in step S3, image reconstruction is performed by the image reconstruction unit 44. Specifically, the image reconstruction unit 44 reads the k-space data from the k-space database 43 and performs image reconstruction processing of the read k-space data, thereby generating image data. The generated image data is written in the image database 45.

Subsequently, in step 54, image data is generated by the image processing unit 46 and an image is displayed on the display unit 34. Specifically, the image processing unit 46 reads the image data form the image database 45 and performs necessary image processing of the read image data, thereby generating image data for displaying. Then, the generated image data for displaying is supplied to the display unit 34, thereby displaying an image on the display unit 34.

Each of images displayed on the display unit 34 is generated based on data acquired in a condition that a phase angle of each RF excitation pulse is controlled so as not to be influenced due to a deviation of a center frequency of a RP excitation pulse from a resonance frequency and/or a B0 magnetic field so that a steady state of a magnetization is maintained satisfactorily. Therefore, a user can undertake diagnosis using a SSFP image of water or fat with an improved contrast.

That is, the foregoing magnetic resonance imaging apparatus 20 as described above is an apparatus configured so as to determine and control a variation amount of a transmission phase angle of a RF excitation pulse based on a difference value between a center frequency of a RF excitation pulse and a resonance frequency of a matter to be a imaging target and/or a variation amount of a B0 magnetic field so as to maintain a steady state of a magnetization more satisfactorily even if there is a factor disturbing the steady state of the magnetization such as adjustment deviation of the center frequency of the RF excitation pulse and/or a variation of the B0 magnetic field in case of acquiring data with a SSFP sequence.

Therefore, according to the magnetic resonance imaging apparatus 20, both a transmission phase angle of a RF excitation pulse and a phase angle of a magnetization are controlled regularly and steady state free precession of the magnetization can be maintained. In addition, a time until a magnetization transforms to a steady state can be reduced in imaging using a SSFP sequence. As a result, a SSFP image with an improved SNR and/or contrast can be obtained.

What is claimed is:

1. A magnetic resonance imaging apparatus comprising:
an input unit configured to input information indicating an object undergoing magnetic resonance imaging of which the resonance frequency of the object undergoing magnetic resonance imaging is a center frequency of an excitation pulse;
a data acquisition unit configured to acquire magnetic resonance data by obtaining a steady state free precession of a magnetization in a desired object undergoing magnetic resonance imaging by applying plural excitation pulses having a same flip angle with a constant repetition time and gradient magnetic fields to an object, the plural excitation pulses each having a transmission phase varying by a variation amount determined based on a difference between a resonance frequency of a desired object undergoing magnetic resonance imaging and the center frequency defined depending on the object undergoing magnetic resonance imaging; and
an image generating unit configured to generate an image of the desired object undergoing magnetic resonance imaging based on the magnetic resonance data,
wherein a zero order moment of gradient magnetic field from each application time of the plural excitation pulses till a center time of a corresponding echo is zero, and wherein a zero order moment of gradient magnetic field from each center time of echoes till an application time of a following excitation pulse included in the gradient magnetic fields is zero.

2. A magnetic resonance imaging apparatus comprising:
a data acquisition unit configured to acquire magnetic resonance data by obtaining a steady state free precession of a magnetization in a desired object undergoing magnetic resonance imaging by applying plural excitation pulses having a same flip angle with a constant repetition time and gradient magnetic fields to an object, the plural excitation pulses each having a transmission phase varying by a variation amount determined based on a phase shift amount due to a fluctuation of a B0 magnetic filed; and
an image generating unit configured to generate an image of the desired object undergoing magnetic resonance imaging based on the magnetic resonance data,
wherein a zero order moment of gradient magnetic field from each application time of the plural excitation pulses till a center time of a corresponding echo is zero, and wherein a zero order moment of gradient magnetic field from each center time of echoes till an application time of a following excitation pulse included in the gradient magnetic fields is zero.

3. A magnetic resonance imaging apparatus of claim 1, wherein said data acquisition unit is configured to apply a pre-pulse of which transmission phase varies by the variation amount from a transmission pulse of a first excitation pulse, the pre-pulse being applied previously to the plural excitation pulses.

4. A magnetic resonance imaging apparatus of claim 1, wherein said data acquisition unit is configured to apply a post-pulse of which transmission phase varies by the variation amount from a transmission pulse of a last excitation pulse, the pre-pulse being applied subsequently to the plural excitation pulses.

5. A magnetic resonance imaging apparatus of claim 1, wherein said data acquisition unit is configured to determine a phase for detection of the magnetic resonance data based on a phase shift depending on a phase encode amount after the detection and A/D conversion of the magnetic resonance data and respective transmission phases of the plural excitation pulses.

6. A magnetic resonance imaging apparatus of claim 1, wherein said data acquisition unit is configured to determine respective transmission phases of the plural excitation pulses so as to vary a magnetization of at least one object undergoing magnetic resonance imaging by $2\pi$ times an integer number.

7. A magnetic resonance imaging apparatus of claim 1, wherein said data acquisition unit is configured to apply the plural excitation pulses each having the transmission phase varying by a variation amount determined based on both the difference between the resonance frequency of the desired object undergoing magnetic resonance imaging and the center frequency and the phase shift amount due to the fluctuation of the B0 magnetic filed.

8. A magnetic resonance imaging apparatus of claim 1, further comprising:
a display unit configured to display a reference image showing information representing the center frequency of the excitation pulse together with a frequency spectrum of magnetic resonance signals.

9. A magnetic resonance imaging method comprising:
inputting information indicating a object undergoing magnetic resonance imaging of which resonance frequency is a center frequency of an excitation pulse;
acquiring magnetic resonance data by obtaining a steady state free precession of a magnetization in a desired object undergoing magnetic resonance imaging by applying plural excitation pulses having a same flip angle with a constant repetition time and gradient magnetic fields to an object, the plural excitation pulses each having a transmission phase varying by a variation amount determined based on a difference between a resonance frequency of a desired object undergoing magnetic resonance imaging and the center frequency defined depending on the object undergoing magnetic resonance imaging; and generating an image of the desired object undergoing magnetic resonance imaging based on the magnetic resonance data, wherein a zero order moment of gradient magnetic field from each application time of the plural excitation pulses till a center time of a corresponding echo is zero, and wherein a zero order moment of gradient magnetic field from each center time of echoes till an application time of a following excitation pulse included in the gradient magnetic fields is zero.

10. A magnetic resonance imaging method comprising:

acquiring magnetic resonance data by obtaining a steady state free precession of a magnetization in a desired object undergoing magnetic resonance imaging by applying plural excitation pulses having a same flip angle with a constant repetition time and gradient magnetic fields to an object, the plural excitation pulses each having a transmission phase varying by a variation amount determined based on a phase shift amount due to a fluctuation of a B0 magnetic filed; and generating an image of the desired object undergoing magnetic resonance imaging based on the magnetic resonance data, wherein a zero order moment of gradient magnetic field from each application time of the plural excitation pulses till a center time of a corresponding echo is zero, and wherein a zero order moment of gradient magnetic field from each center time of echoes till an application time of a following excitation pulse included in the gradient magnetic fields is zero.

11. A magnetic resonance imaging method of claim 9, wherein a pre-pulse of which transmission phase varies by the variation amount from a transmission pulse of a first excitation pulse is applied previously to the plural excitation pulses.

12. A magnetic resonance imaging method of claim 9, wherein a post-pulse of which transmission phase varies by the variation amount from a transmission pulse of a last excitation pulse is applied subsequently to the plural excitation pulses.

13. A magnetic resonance imaging method of claim 9, wherein a phase for detection of the magnetic resonance data is determined based on a phase shift depending on a phase encode amount after the detection and A/D conversion of the magnetic resonance data and respective transmission phases of the plural excitation pulses.

14. A magnetic resonance imaging method of claim 9, wherein respective transmission phases of the plural excitation pulses are determined so as to vary a magnetization of at least one object undergoing magnetic resonance imaging by $2\pi$ times an integer number.

15. A magnetic resonance imaging method of claim 9, wherein the plural excitation pulses each having the transmission phase varying by a variation amount determined based on both the difference between the resonance frequency of the desired object undergoing magnetic resonance imaging and the center frequency and the phase shift amount due to the fluctuation of the B0 magnetic filed are applied.

16. A magnetic resonance imaging method of claim 9, further comprising:

displaying a reference image showing information representing the center frequency of the excitation pulse together with a frequency spectrum of magnetic resonance signals.

* * * * *